US011366202B2

(12) United States Patent
Wang et al.

(10) Patent No.: US 11,366,202 B2
(45) Date of Patent: Jun. 21, 2022

(54) SEMICONDUCTOR LASER AND OPTICAL AMPLIFIER PHOTONIC PACKAGE

(71) Applicant: OURS Technology, LLC, Mountain View, CA (US)

(72) Inventors: Lei Wang, Fremont, CA (US); Sen Lin, Santa Clara, CA (US); Andrew Steil Michaels, Santa Clara, CA (US)

(73) Assignee: OURS Technology, LLC, Mountain View, CA (US)

( * ) Notice: Subject to any disclaimer, the term of this patent is extended or adjusted under 35 U.S.C. 154(b) by 0 days.

(21) Appl. No.: 17/362,080

(22) Filed: Jun. 29, 2021

(65) Prior Publication Data

US 2022/0003845 A1 Jan. 6, 2022

Related U.S. Application Data

(60) Provisional application No. 63/046,906, filed on Jul. 1, 2020.

(51) Int. Cl.
*G01C 3/08* (2006.01)
*G01S 7/481* (2006.01)
*H01S 5/02253* (2021.01)

(52) U.S. Cl.
CPC ........ *G01S 7/4814* (2013.01); *H01S 5/02253* (2021.01)

(58) Field of Classification Search
CPC ............................ G01S 7/4814; H01S 5/02253
See application file for complete search history.

(56) References Cited

U.S. PATENT DOCUMENTS

| 10,948,600 | B1 * | 3/2021 | Barber | G01S 17/34 |
|---|---|---|---|---|
| 2010/0006784 | A1 | 1/2010 | Mack et al. | |
| 2017/0184450 | A1 * | 6/2017 | Doylend | G01S 7/4817 |
| 2017/0371227 | A1 * | 12/2017 | Skirlo | G02F 1/3136 |
| 2018/0052378 | A1 | 2/2018 | Shin et al. | |
| 2019/0089111 | A1 | 3/2019 | Lee et al. | |
| 2020/0049886 | A1 | 2/2020 | Chriqui et al. | |
| 2020/0150241 | A1 | 5/2020 | Byrnes et al. | |
| 2020/0166705 | A1 | 5/2020 | Pelletier | |

OTHER PUBLICATIONS

International Searching Authority, Patent Cooperation Treaty, Written Opinion of the International Searching Authority, International Application No. PCT/US2021/04003, Notification Date: Oct. 26, 2021, 13 pages.
Klamkin, Jonathan et al. "Indium Phosphide Photonic Integrated Circuits: Technology and Applications", 2018 IEEE Bicmos and Compound Semiconductor Integrated Circuits and Technology Symposium (BCICTS), IEEE, Oct. 15, 2018, pp. 8-18, XP033458214, DOI: 10.1109/BCICTS.2018.8550947.

* cited by examiner

*Primary Examiner* — Mark Hellner
(74) *Attorney, Agent, or Firm* — Freestone Intellectual Property Law PLLC; Aaron J. Visbeek; William J. Pigott

(57) ABSTRACT

A light detection and ranging (LIDAR) device includes a laser assembly tier and a photonic integrated circuit (PIC) tier. The laser assembly tier includes a laser configured to emit laser light. The PIC tier includes a semiconductor optical amplifier (SOA) and a PIC wafer configured to incouple laser light into the PIC wafer and direct the laser light to the SOA.

20 Claims, 18 Drawing Sheets

SEMICONDUCTOR LASER AND OPTICAL AMPLIFIER PHOTONIC PACKAGE

CROSS-REFERENCE TO RELATED APPLICATIONS

This application claims priority to U.S. provisional Application No. 63/046,906 filed Jul. 1, 2020, which is hereby incorporated by reference.

TECHNICAL FIELD

This disclosure relates generally to lasers and in particular to photonics packaging.

BACKGROUND INFORMATION

Over the past twenty years, there has been tremendous development of silicon photonic devices for a wide range of applications including communication and sensing, such as optical interconnect and light detection and ranging (LIDAR). Silicon photonics offers many advantages over other photonic technology platforms due to silicon's unique material properties. For all its benefits, however, it is quite challenging to package silicon photonic devices with the necessary light sources such as lasers and optical amplifiers, and with glass fibers, due to the very small optical mode field of single mode silicon waveguides. Also, for the sake of compactness and power consumption constraint the light sources involved are often semiconductor laser diodes and semiconductor optical amplifiers (SOA), made from compound semiconductor materials, which are preferably packaged in hermetically sealed enclosures.

It is commonly agreed that the packaging cost of silicon photonic products significantly outweighs the cost of wafer fabrication for producing silicon photonic integrated circuit (PIC), laser diodes (LD), and SOA chips. Innovation and development are needed in technologies of packaging silicon photonic devices.

BRIEF SUMMARY OF THE INVENTION

Implementations of the disclosure include a light detection and ranging (LIDAR) device for an autonomous vehicle. The LIDAR device includes a laser assembly tier and a photonic integrated circuit (PIC) tier. The laser assembly tier includes a laser configured to emit laser light. The PIC tier includes a semiconductor optical amplifier (SOA) and a PIC wafer configured to incouple the laser light into the PIC wafer and direct the laser light to the SOA.

In an implementation, the LIDAR device further includes a wafer layer disposed between the laser assembly tier and the PIC wafer. The laser light is infrared laser light and the wafer layer is transparent to the infrared laser light.

In an implementation, the wafer layer includes a lens configured to receive the infrared laser light from the laser assembly tier and the lens is integrated into the wafer layer and configured to focus the infrared laser light to an input grating of the PIC wafer.

In an implementation, the wafer layer includes a laser carrier wafer and an SOA cap wafer. The laser is coupled to the laser carrier wafer. The SOA cap wafer seals the SOA from an environment of the LIDAR device and the SOA cap wafer is disposed between the PIC wafer and the laser carrier wafer.

In an implementation, the wafer layer and the PIC wafer are formed of single crystalline silicon.

In an implementation, the wafer layer seals the SOA from an environment of the LIDAR device and the laser is coupled to the wafer layer.

In an implementation, the PIC wafer includes a lens configured to receive the laser light from the laser assembly tier and the lens is integrated into the PIC wafer and configured to focus the laser light to an input grating of the PIC wafer.

In an implementation, the PIC wafer includes an exit feature integrated into the PIC wafer. The exit feature is configured to receive amplified laser light generated by the SOA and outcouple the amplified laser light from the PIC wafer.

In an implementation, the laser assembly tier includes a laser lens disposed between the laser and a mirror of the PIC tier. The laser lens is configured to collimate the laser light emitted from the laser.

In an implementation, the SOA is flip-bonded to the PIC wafer.

In an implementation, the PIC wafer includes a trench sized to receive solder for the SOA and pedestals formed of the PIC wafer to mechanically support the SOA and to provide vertical alignment reference.

In an implementation, the PIC wafer includes one or more edge couplers to receive the laser light from an input grating of the PIC wafer. The one or more edge couplers are configured to incouple the laser light into the SOA.

In an implementation, an output grating of the PIC wafer is disposed deeper into the PIC wafer than the input grating.

In an implementation, the laser assembly tier further includes a capping layer sealing the laser from an environment of the LIDAR device and a mirror disposed on an angled wall of the capping layer. The PIC wafer includes an input grating and an output grating. The input grating is configured to incouple the laser light reflected from the mirror and direct the laser light to the SOA. The output grating is configured to receive amplified laser light from the SOA and outcouple the amplified laser light out of the PIC wafer.

Implementations of the disclosure include an autonomous vehicle control system including a LIDAR device, photodetectors, and one or more processors. The LIDAR device includes a laser assembly tier and a PIC tier. The laser assembly tier includes an infrared laser configured to emit infrared laser light. The PIC tier includes an SOA and a PIC wafer configured to incouple the infrared laser light into the PIC wafer and direct the infrared laser light to the SOA. The photodetector is configured to receive reflected infrared laser light from targets in an environment of the autonomous vehicle control system that reflect amplified laser light generated by the SOA. The one or more processors control the autonomous vehicle control system in response to signals generated by the photodetector.

In an implementation, the wafer layer is disposed between the laser assembly tier and the PIC wafer. The wafer layer is transparent to the infrared laser light.

In an implementation, the wafer layer includes a lens configured to receive the infrared laser light from the laser assembly tier. The lens is integrated into the wafer layer and configured to focus the infrared laser light to an input grating of the PIC wafer.

In an implementation, the wafer layer includes a laser carrier wafer and an SOA cap wafer. The laser is coupled to the laser carrier wafer. The SOA cap wafer seals the SOA from an environment of the LIDAR device and the SOA cap wafer is disposed between the PIC wafer and the laser carrier wafer.

Implementations of the disclosure include an autonomous vehicle including a LIDAR device, photodetectors, and one or more processors. The LIDAR device includes a laser assembly tier and a photonic integrated circuit (PIC) tier. The laser assembly tier includes a near-infrared laser configured to emit near-infrared laser light. The PIC tier includes a semiconductor optical amplifier (SOA) and a PIC wafer configured to incouple the near-infrared laser light into the PIC wafer and direct the near-infrared laser light to the SOA. The photodector is configured to receive reflected near-infrared laser light from targets in an environment of the autonomous vehicle that reflect amplified laser light generated by the SOA. The one or more processors control the autonomous vehicle in response to signals generated by the photodetector.

In an implementation, a wafer layer is disposed between the laser assembly tier and the PIC wafer. The wafer layer is transparent to the near-infrared laser light.

BRIEF DESCRIPTION OF THE DRAWINGS

Non-limiting and non-exhaustive implementations of the invention are described with reference to the following figures, wherein like reference numerals refer to like parts throughout the various views unless otherwise specified.

DETAILED DESCRIPTION

Figure 1A:
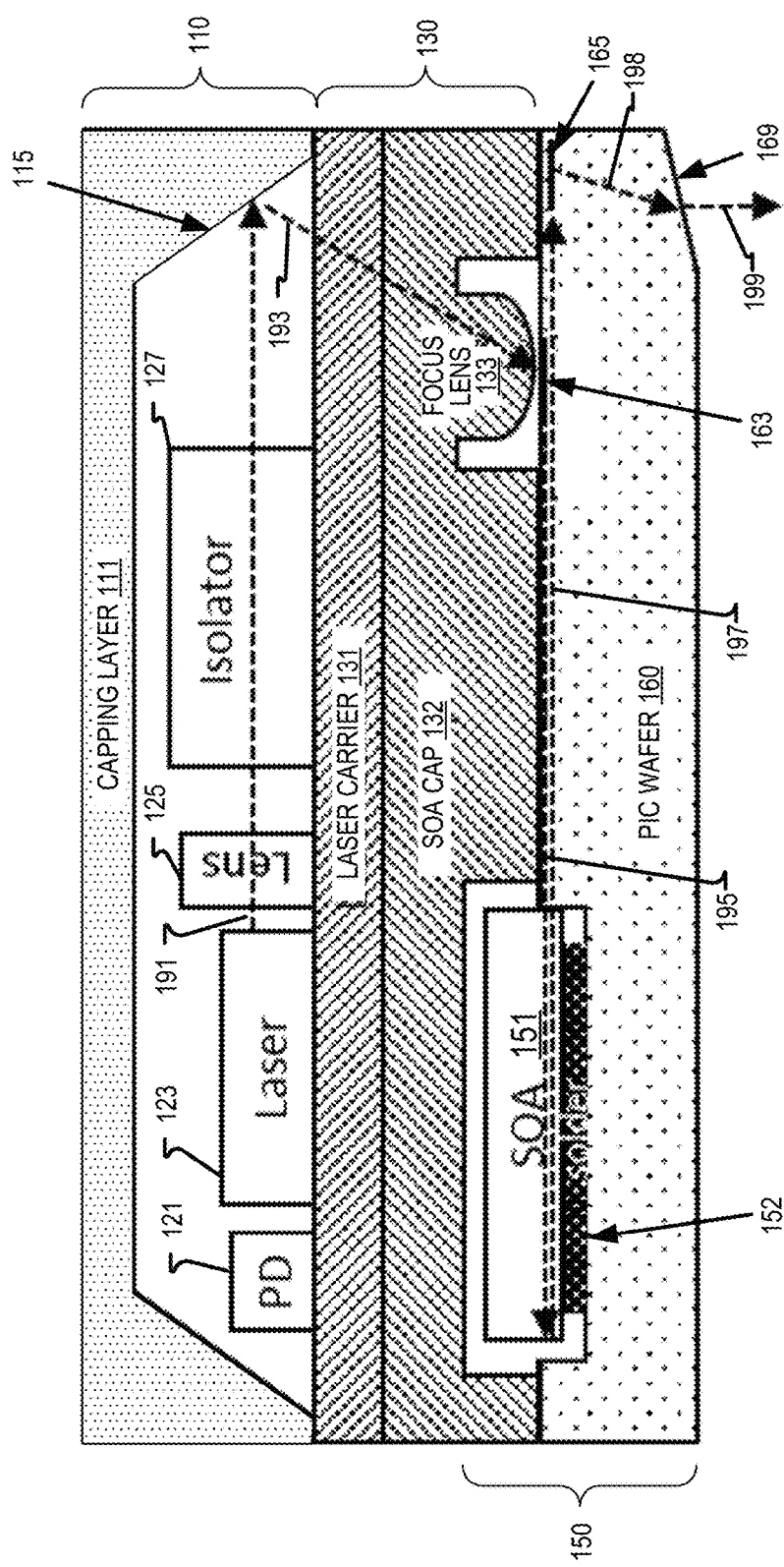
FIGS. 1A and 1B illustrate a device including a laser assembly tier and a PIC tier, in accordance with implementations of the disclosure.

Implementations of laser and photonics packaging that may be implemented in light detection and ranging (LIDAR) devices and systems are described herein. In the following description, numerous specific details are set forth to provide a thorough understanding of the implementations. One skilled in the relevant art will recognize, however, that the techniques described herein can be practiced without one or more of the specific details, or with other methods, components, or materials. In other instances, well-known structures, materials, or operations are not shown or described in detail to avoid obscuring certain aspects.

Reference throughout this specification to "one implementation" or "an implementation" means that a particular feature, structure, or characteristic described in connection with the implementation is included in at least one implementation of the present invention. Thus, the appearances of the phrases "in one implementation" or "in an implementation" in various places throughout this specification are not necessarily all referring to the same implementation. Furthermore, the features, structures, or characteristics may be combined in any suitable manner in one or more implementations.

The automobile industry is currently developing autonomous features for controlling vehicles under certain circumstances. According to SAE International standard J3016, there are 6 levels of autonomy ranging from Level 0 (no autonomy) up to Level 5 (vehicle capable of operation without operator input in all conditions). A vehicle with autonomous features utilizes sensors to sense the environment that the vehicle navigates through. Acquiring and processing data from the sensors allows the vehicle to navigate through its environment. Autonomous vehicles may include one or more of the disclosed LIDAR devices and systems for sensing its environment.

Throughout this specification, several terms of art are used. These terms are to take on their ordinary meaning in the art from which they come, unless specifically defined herein or the context of their use would clearly suggest otherwise. For the purposes of this disclosure, the term "autonomous vehicle" includes vehicles with autonomous features at any level of autonomy of the SAE International standard J3016.

In aspects of this disclosure, visible light may be defined as having a wavelength range of approximately 380 nm-700 nm. Non-visible light may be defined as light having wavelengths that are outside the visible light range, such as ultraviolet light and infrared light. Infrared light having a wavelength range of approximately 700 nm-1 mm includes near-infrared light. In aspects of this disclosure, near-infrared light may be defined as having a wavelength range of approximately 700 nm-1.6 μm.

In implementations of this disclosure, the term "transparent" may be defined as having greater than 90% transmission of light. In some implementations, the term "transparent" may be defined as a material having greater than 90% transmission of visible light.

This disclosure is related to the construction of hermetically sealed silicon photonic devices with semiconductor lasers and optical amplifiers using silicon micro optic bench (MOB) with wafer level packaging techniques. Implementations of the disclosure describe designs and assembly processes of silicon photonic packages comprising silicon photonics integrated circuit (PIC), laser diodes, and semiconductor optical amplifier (SOA), as well as other optoelectronic and micro optic components, such as photodiodes (PD), focusing lens, isolators, prism, mirrors, etc. The carrier and enclosure of such packages may be silicon micro bench fabricated using silicon micro machining techniques. The assembling processes may be conducted at die or wafer level and the hermetical sealing may be achieved by wafer bonding in vacuum or under inert ambient. The completed wafer assembly can be tested with wafer-level automated testing and then diced into individual dies, which contain hermetically sealed PIC, LD, and SOA—ready to be integrated with other electronic processing units.

FIG. 1A illustrates a device 100 including a laser assembly tier 110 and a PIC tier 150, in accordance with implementations of the disclosure. Device 100 may be included in a LIDAR device and/or system that is utilized in an autonomous vehicle. Device 100 illustrates an example photonic package including a silicon PIC wafer 160, one or more laser diodes 123, and SOA 151. Device 100 may also include other optoelectronic and micro optic components such as additional photodiodes, additional focusing lenses, prism, mirrors, and/or beam monitoring, correcting, and steering components.

Laser assembly tier 110 includes a laser 123 configured to emit laser light 191. Laser 123 may be a continuous wave (CW) laser. Laser 123 may be an infrared laser emitting infrared laser light. Laser 123 may be a near-infrared laser emitting near-infrared laser light. In FIG. 1A, laser assembly tier 110 also includes photodiode 121, laser lens 125, and isolator 127. Laser assembly tier 110 also includes a capping layer 111 that seals laser 123 (and the other components of laser assembly tier 110) from an environment of device 100. A mirror 115 is disposed on an angled wall of capping layer 111. In some implementations, mirror 115 may be a discrete component that is not disposed on the angled wall of capping layer 111.

A wafer layer 130 of device 100 is disposed between laser assembly tier 110 and PIC wafer 160 of PIC tier 150. Wafer layer 130 may be silicon. In an implementation, wafer layer 130 is formed of a single crystalline silicon. Notably, silicon is at least partially transparent at infrared wavelengths. Silicon may be considered transparent at some infrared wavelengths. In FIG. 1A, wafer layer 130 includes a laser carrier wafer 131 and a SOA cap wafer 132. Laser carrier wafer 131 and a SOA cap wafer 132 may be silicon or other semiconductor material. Laser carrier wafer 131 and SOA cap wafer 132 may be bonded together. Optical components 121, 123, 125, and isolator 127 may be coupled to laser carrier wafer 131. Capping layer 111 is supported by laser carrier wafer 131.

Wafer layer 130 is configured to seal SOA 151 from an environment of device 100. In the particular implementation of FIG. 1A, SOA cap wafer 132 is configured to seal SOA 151 from an environment of device 100. SOA cap wafer 132 is disposed between PIC wafer 160 and laser carrier wafer 131. Wafer layer 130 includes a focusing lens 133 configured to receive laser light 193 from laser assembly tier 110 (reflected from mirror 115 in the illustrated implementation of FIG. 1A). Focusing lens 133 is integrated into wafer layer 130. In FIG. 1A, focusing lens 133 is integrated into SOA cap wafer 132. Focusing lens 133 is configured to focus laser light 193 to input grating 163 of PIC wafer 160. A lensing curvature of focusing lens 133 may be formed in a subtractive process (e.g. plasma etching techniques) to form focusing lens 133 in SOA cap wafer 132.

In an implementation, PIC wafer 160 is formed of a single crystalline silicon. PIC wafer 160 includes an input grating 163 and an output grating 165. Input grating 163 and output grating 165 may be diffractive optical elements formed in the single crystalline silicon. The input grating 163 is configured to incouple laser light 193 (reflected from mirror 115) and direct the laser light 193 to SOA 151 as incoupled laser light 195. Input grating 163 may be formed using surface-relief techniques. Input grating 163 may be designed to incouple (and redirect) light having a particular wavelength and received at a particular angle. Focusing lens 133 may be configured to receive laser light 193 and illuminate input grating 163 at a particular angle that increases the efficiency of input grating 163. Focusing lens 133 may also be configured to illuminate a two-dimensional area of input grating 163 to increase and/or maximize incoupling efficiency.

Figure 1B:
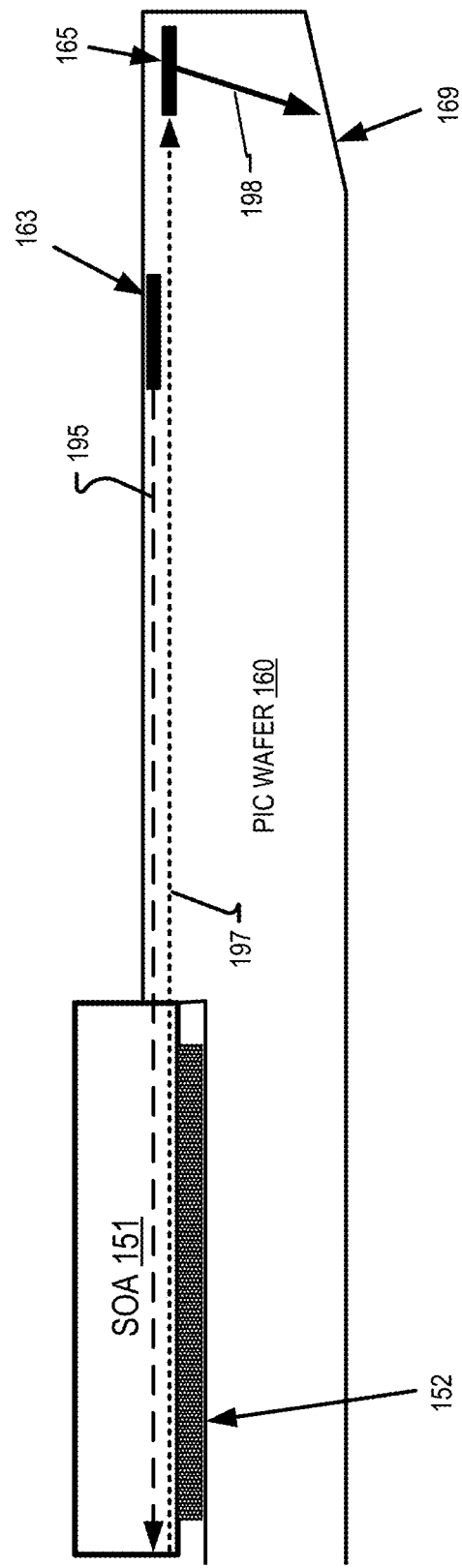

SOA 151 receives incoupled laser light 195 from input grating 163. Incoupled laser light 195 is amplified by SOA 151 and directed to output grating 165 as amplified laser light 197. FIG. 1B illustrates a slightly larger view of PIC wafer 160 and SOA 151. In FIG. 1B, incoupled laser light 195 is represented by a dashed-line arrow and amplified laser light 197 is represented by a dotted-line arrow. In FIG. 1A, solder 152 secures SOA 151 to PIC wafer 160. SOA 151 may be flip-bonded to PIC wafer 160. Electrical pads and traces may be formed on PIC wafer 160 to connect SOA 151 to PIC wafer 160. Output grating 165 is configured to receive amplified laser light 197 from SOA 151 and outcouple the amplified laser light 197 out of PIC wafer 160. In the illustration of FIG. 1A, output grating 165 generates output light 198. Exit feature 169 receives amplified laser light and outcouples the amplified laser light from PIC wafer 160 as exit light 199. In the particular implementation of FIG. 1A, exit feature 169 receives amplified laser light 197 by way of output grating 165 as output light 198. Exit feature 169 may be integrated into PIC wafer 160 and designed to direct exit light 199 at a particular design angle to another device (not illustrated). In particular implementation of FIG. 1A, exit feature 169 is a prism structure that may be formed in a subtractive process (e.g. chemical etching technique) of PIC wafer 160.

In operation, laser 123 emits laser light 191. Laser lens 125 may collimate the laser light. Laser lens 125 is disposed between laser 123 and mirror 115. In the specific implementation of FIG. 1A, laser lens 125 is disposed between isolator 127 and laser 123. Isolator 127 receives the laser light 191 from laser lens 125. Isolator 127 optically isolates laser 123 from the optical elements subsequent to isolator 127 in the optical system. For example, isolator 127 prevents laser light from being reflected back to laser 123 by mirror 115. Mirror 115 receives the laser light from isolator 127 and reflects the laser light to lens 133 as laser light 193. Since laser light 193 may be infrared laser light and silicon is at least partially transparent to infrared light, laser light 193 propagates to focusing lens 133. Focusing lens 133 focuses laser light 193 to input grating 163 and input grating 163 incouples the laser light 193 into PIC wafer 160 as incoupled laser light 195.

Incoupled laser light 195 may propagate to SOA 151 confined by waveguides (not specifically illustrated) formed in PIC wafer 160. PIC wafer 160 may include edge couplers (not specifically illustrated in FIG. 1A) that may receive incoupled laser light 195 and facilitate incoupling laser light 195 into one or more inputs of SOA 151. SOA 151 amplifies incoupled laser light 195 and outputs amplified laser light 197. PIC wafer 160 may include edge couplers (not specifically illustrated in FIG. 1A) that may facilitate outputting amplified laser light 197 into PIC wafer 160. Amplified laser light 197 may propagate to output grating 165 confined by waveguides (not specifically illustrated) formed in PIC wafer 160. Output grating 165 receives amplified laser light 197 and redirects the light as output light 198. Exit feature 169 receives output light 198 and outcouples the light as exit light 199.

Figure 2:
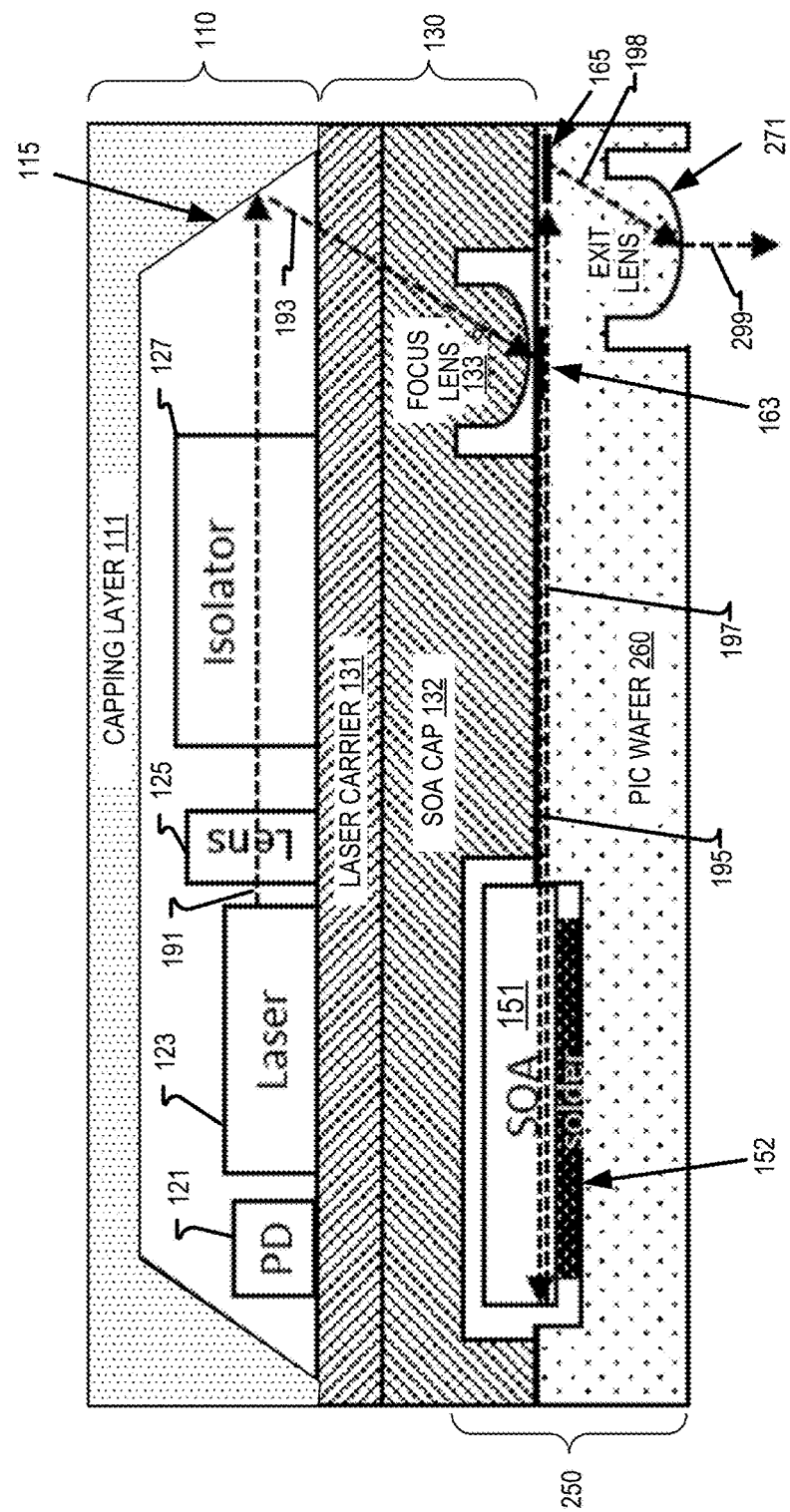
FIG. 2 illustrates a device including a laser assembly tier and a PIC tier including an exit lens as the exit feature of a PIC wafer, in accordance with implementations of the disclosure.

FIG. 2 illustrates a device 200 including a laser assembly tier 110 and a PIC tier 250 including an exit lens 271 as the exit feature of PIC wafer 260, in accordance with implementations of the disclosure. Device 200 includes some of the same structure as device 100 although the exit feature of PIC wafer 260 is an exit lens 271 rather than a prism. Exit lens 271 is integrated into PIC wafer 260. A lensing curvature of exit lens 271 may be formed in a subtractive process (e.g. plasma etching techniques) that forms exit lens 271 in PIC wafer 260. The lensing curvature may be spherical or aspherical and configured to output exit light 299 at a particular angle.

Figure 3:
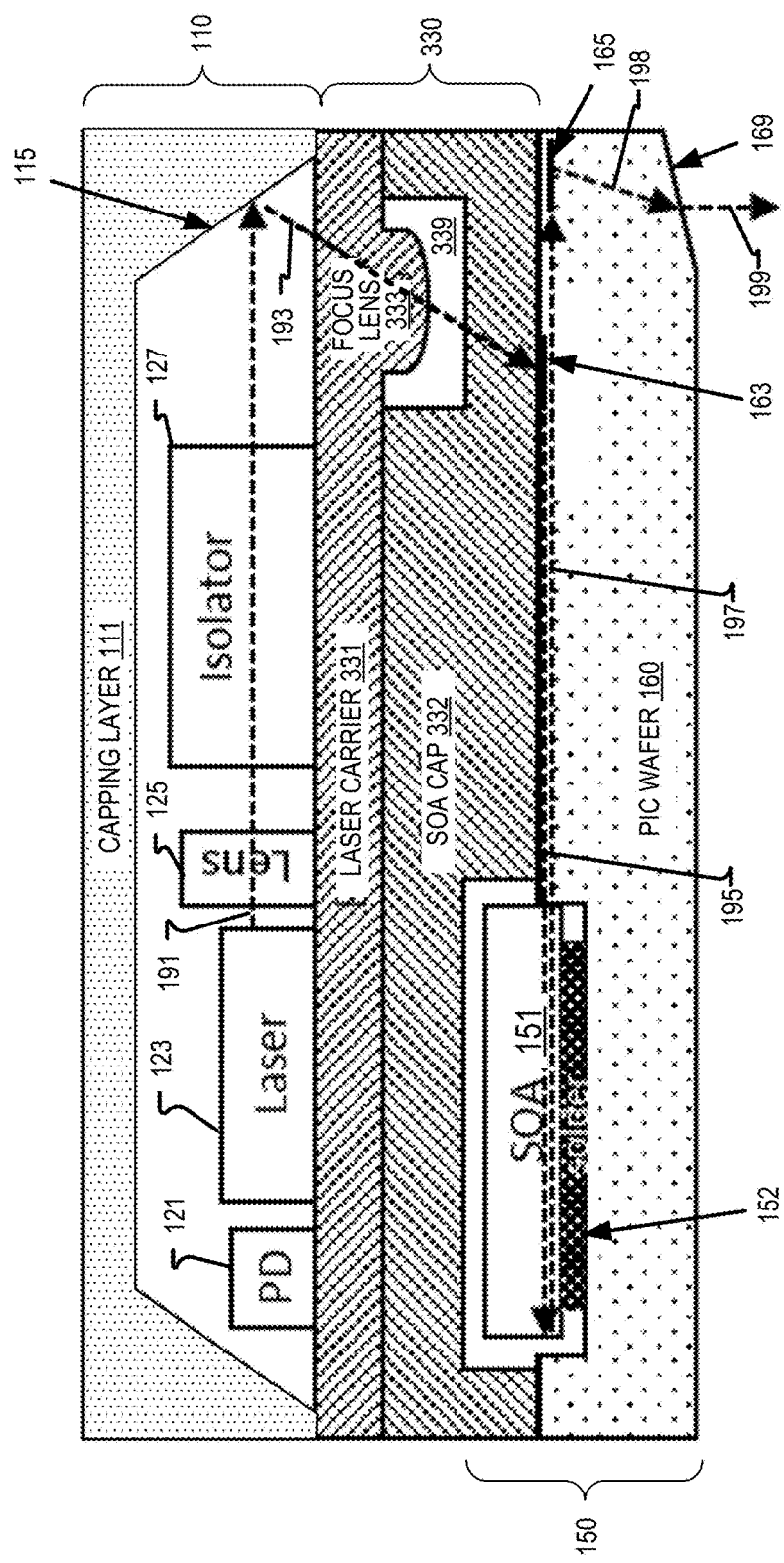
FIG. 3 illustrates a device including a laser assembly tier and a wafer layer including a focusing lens included in a laser carrier wafer of the wafer layer, in accordance with implementations of the disclosure.

FIG. 3 illustrates a device 300 including a laser assembly tier 110 and a wafer layer 330 including a focusing lens 333 included in laser carrier wafer 331 of wafer layer 330, in accordance with implementations of the disclosure. Device 300 includes some of the same structure as device 100 although the focusing lens 333 is integrated into laser carrier wafer 331 rather than having focusing lens 133 integrated into SOA cap wafer 132, as in FIG. 1A. In FIG. 3, focusing lens 333 is formed of laser carrier wafer 331 and a corresponding void 339 is formed in SOA cap wafer 332 to accommodate the focusing lens 333 protruding into SOA cap wafer 332. A lensing curvature of focusing lens 333 may be formed in a subtractive process (e.g. plasma etching techniques) that forms focusing lens 333 in laser carrier wafer 331. The lensing curvature may be spherical or aspherical and configured to focus laser light 193 to input grating 163 at a particular angle.

Figure 4:
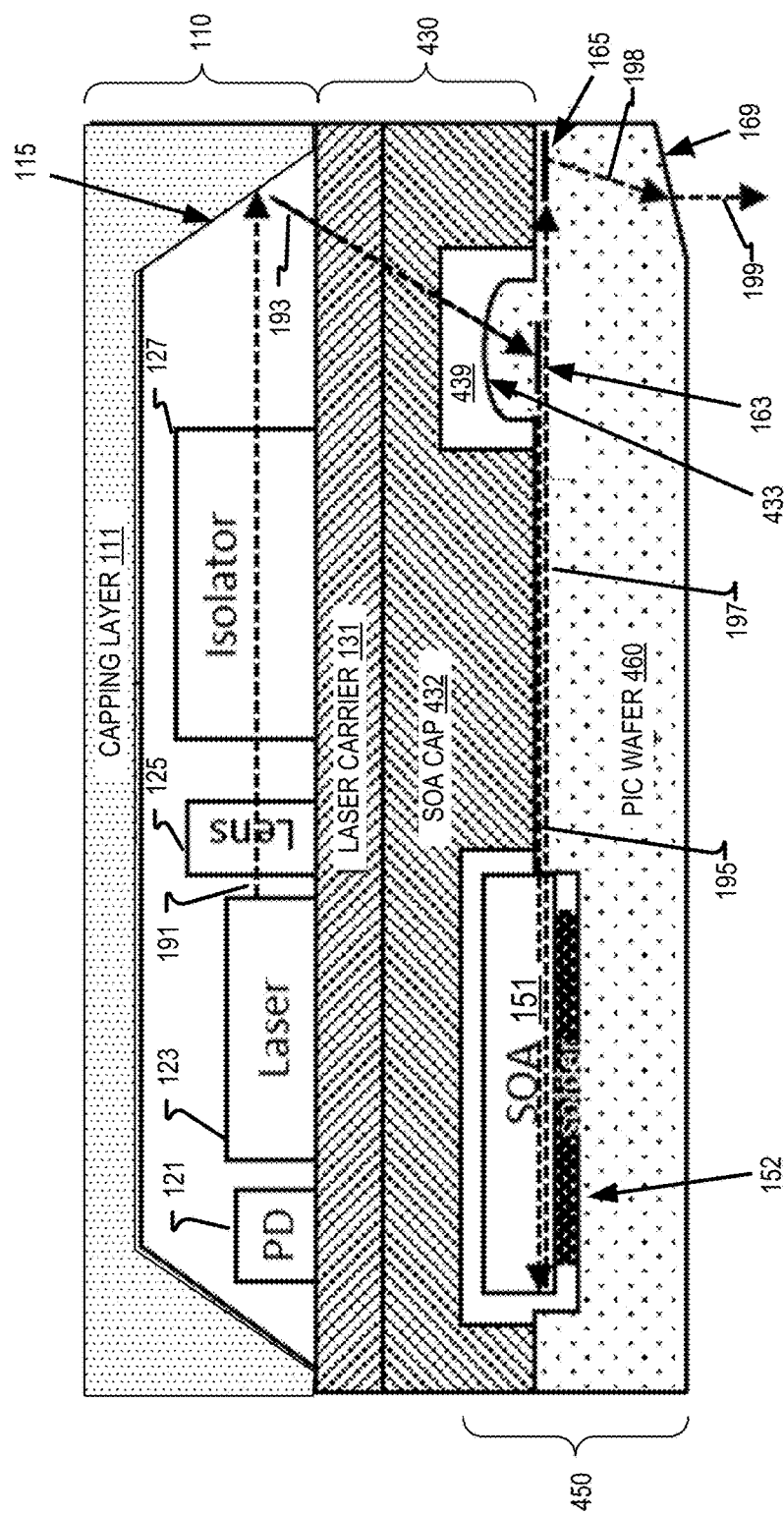
FIG. 4 illustrates a device including a laser assembly tier and a focusing lens included in a PIC wafer of a PIC tier, in accordance with implementations of the disclosure.

FIG. 4 illustrates a device 400 including a laser assembly tier 110 and a focusing lens 433 included in PIC wafer 460 of PIC tier 450, in accordance with implementations of the disclosure. Device 400 includes some of the same structure as device 100 although focusing lens 433 is integrated into PIC wafer 460 rather than having focusing lens 133 integrated into SOA cap wafer 132, as in FIG. 1A. In FIG. 4, focusing lens 433 is formed of PIC wafer 460 and a corresponding void 439 is formed in SOA cap wafer 432 of wafer layer 430 to accommodate the focusing lens 433 protruding into SOA cap wafer 432. A lensing curvature of focusing lens 433 may be formed in a subtractive process (e.g. plasma etching techniques) that forms focusing lens 433 in PIC wafer 460. The lensing curvature may be spherical or aspherical and configured to focus laser light 193 to input grating 163 at a particular angle.

Figure 5:
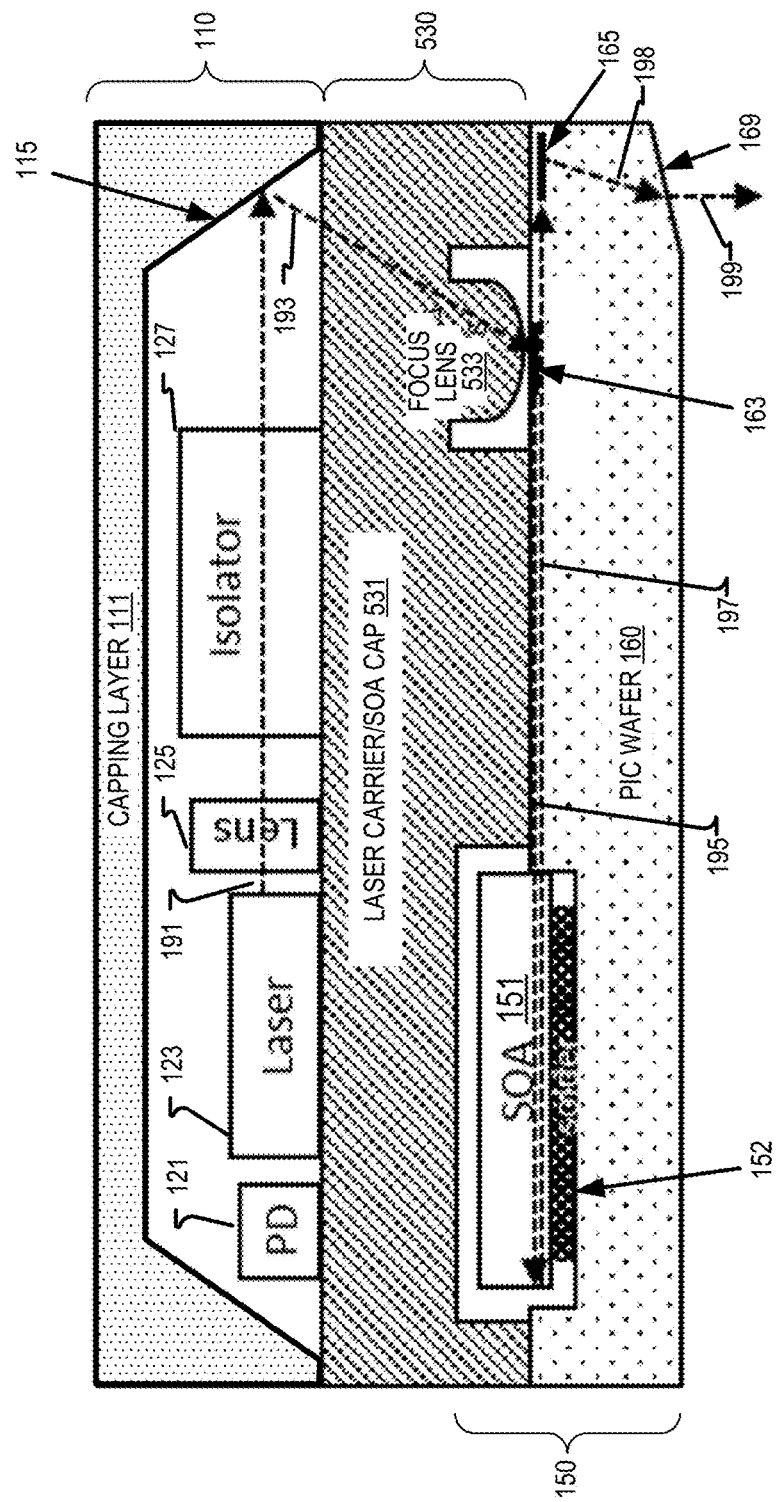
FIG. 5 illustrates a device including a laser assembly tier and a focusing lens included in an integrated wafer of a wafer layer, in accordance with implementations of the disclosure.

FIG. 5 illustrates a device 500 including a laser assembly tier 110 and a focusing lens 533 included in an integrated wafer 531 of wafer layer 530, in accordance with implementations of the disclosure. Integrated wafer 531 functions as both the laser carrier wafer and the SOA cap layer. Wafer layer 530 may be formed of a contiguous layer of silicon. In FIG. 5, focusing lens 533 is formed of integrated wafer 531. A lensing curvature of focusing lens 533 may be formed in a subtractive process (e.g. plasma etching techniques) that forms focusing lens 533 in integrated wafer 531. The lensing curvature may be spherical or aspherical and configured to focus laser light 193 to input grating 163 at a particular angle.

Figure 6:
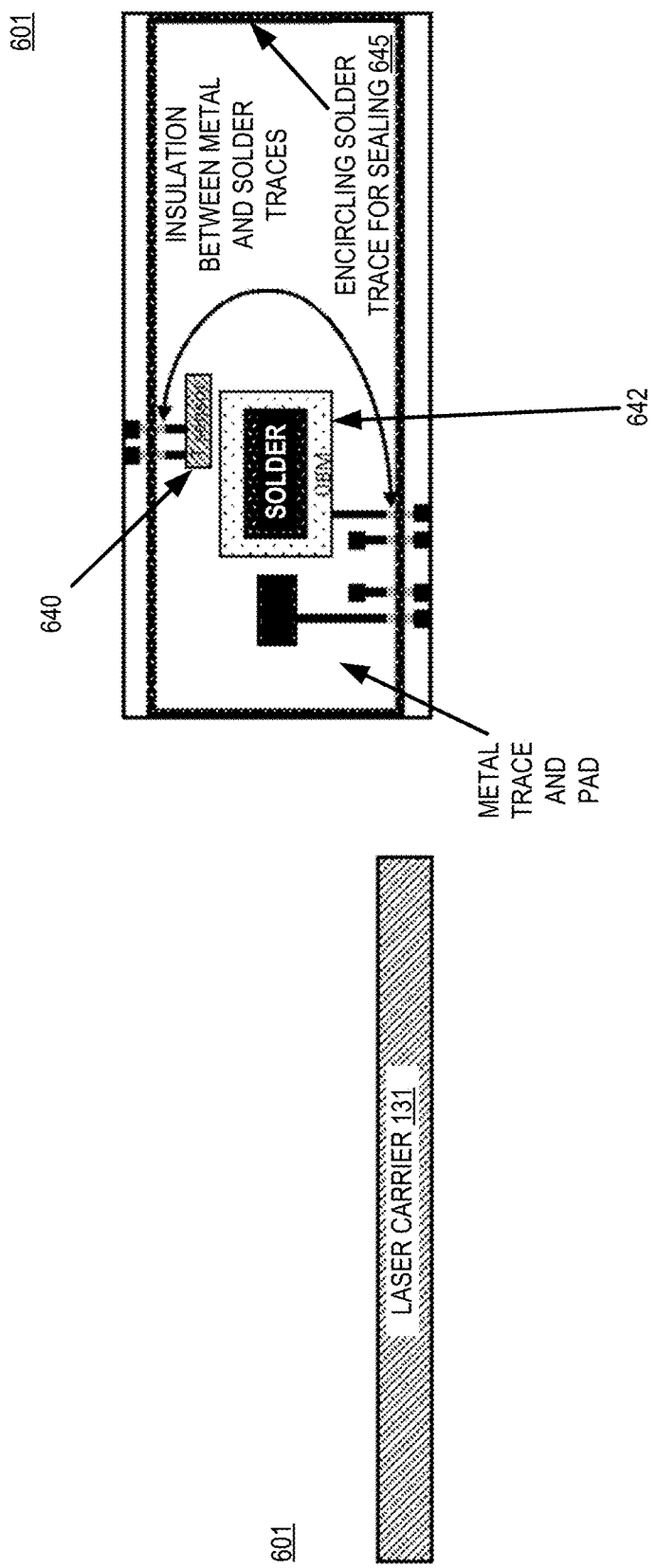
FIGS. 6-9 illustrate side views and top views of optical structures for fabricating a laser and photonics device, in accordance with implementations of the disclosure.

FIG. 6 illustrates a side view and a top view of an optical structure 601 for fabricating a laser and photonics device, in accordance with implementations of the disclosure. The left side of FIG. 6 illustrates a side view of optical structure 601 that includes laser carrier wafer 131. The right side of FIG. 6 illustrates a top view of optical structure 601 that includes a temperature sensor 640 and under-bump metal (UBM) pads 642. Metal traces and pads may be formed on laser carrier wafer 131 to facilitate providing power to devices and transmitting and receiving electrical signals. A solder trace may encircle or surround the traces and pads for the electrical and/or optical components to assist in hermetically sealing electrical and/or optical components from an environment of the device that is being fabricated. Fabrication of optical structure 601 may include fabricating the laser carrier wafer with thin film structures such as temperature sensor 640, metal film stack for soldering, and electrical traces for power supply and device monitoring.

Figure 7:
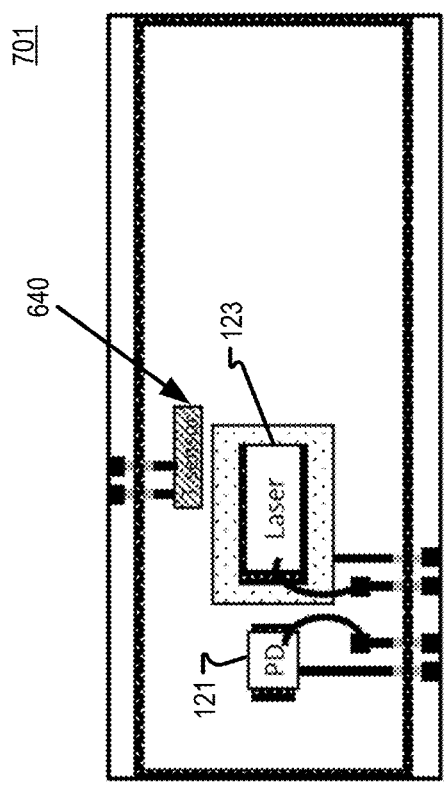
Figure 7:
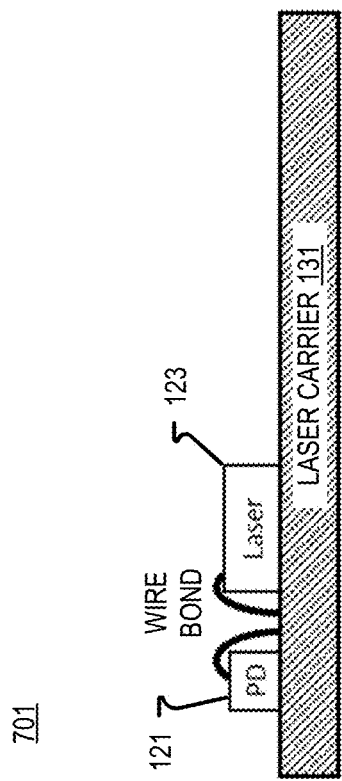

FIG. 7 illustrates a side view and a top view of an optical structure 701 for fabricating a laser and photonics device, in accordance with implementations of the disclosure. The left side of FIG. 7 illustrates a side view of optical structure 701 having photodiode 121 and laser 123 coupled to laser carrier wafer 131. Photodiode 121 and laser 123 may be wire-bonded with gold wires to electrical pads formed on laser carrier wafer 131. The right side of FIG. 7 illustrates a top view of optical structure 701 including photodiode 121 and laser 123 wire-bonded to electrical pads formed on laser carrier wafer 131. In some implementations, the electrical connections of electrical components are made with vias including through-silicon-via (TSV).

Figure 8:
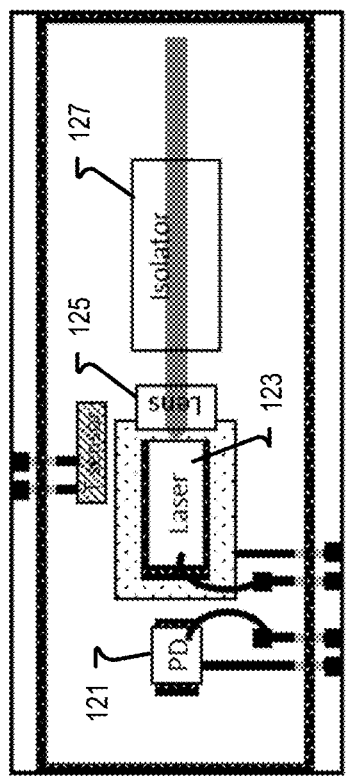
Figure 8:
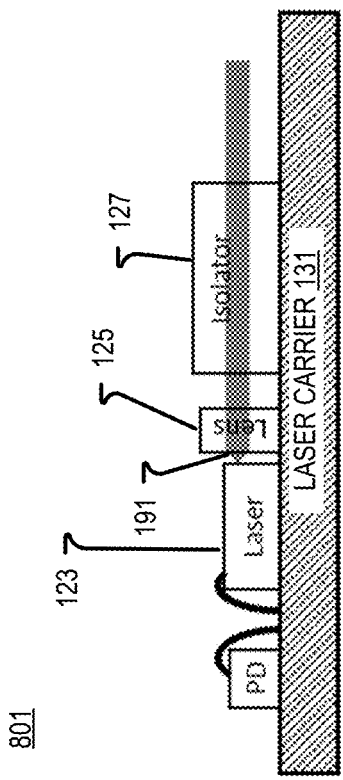

FIG. 8 illustrates a side view and a top view of an optical structure 801 for fabricating a laser and photonics device, in accordance with implementations of the disclosure. The left side of FIG. 8 illustrates a side view of optical structure 801 having photodiode 121, laser 123, laser lens 125 and isolator 127 coupled to laser carrier wafer 131. Laser lens 125 and isolator 127 may be considered passive photonic devices. Laser beam collimation and alignment may be achieved with active alignment during the assembling process. Laser 123 emits laser light 191 and laser lens 125 collimates laser light 191 into collimated laser light. The right side of FIG. 8 illustrates a top view of optical structure 801.

Figure 9:
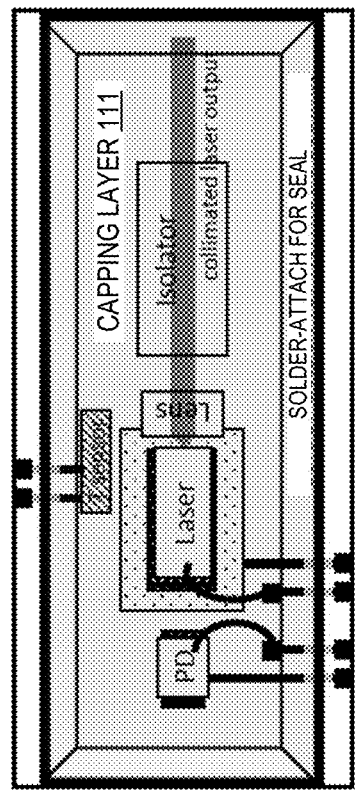
Figure 9:
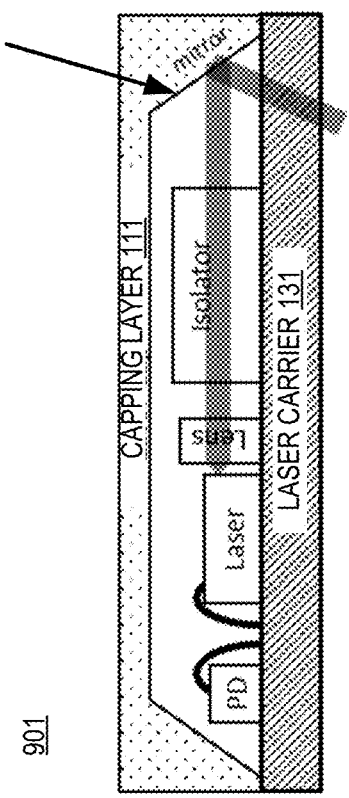

FIG. 9 illustrates a side view and a top view of an optical structure 901 for fabricating a laser and photonics device, in accordance with implementations of the disclosure. The left side of FIG. 9 illustrates a side view of optical structure 901 having a capping layer 111 capping and sealing the electrical and optical components of optical structure 801. The capping process of FIG. 9 may be performed in vacuum or under inert ambient to provide hermetic sealing of the lasers. Capping layer 111 also includes a built-in mirror 115 to redirect laser light toward the PIC tier (not illustrated in FIG. 9). The right side of FIG. 9 illustrates a top view of optical structure 901. Capping layer 111 may be sized to match the solder trace to seal the electrical and optical components included in optical structure 901.

Figure 10:
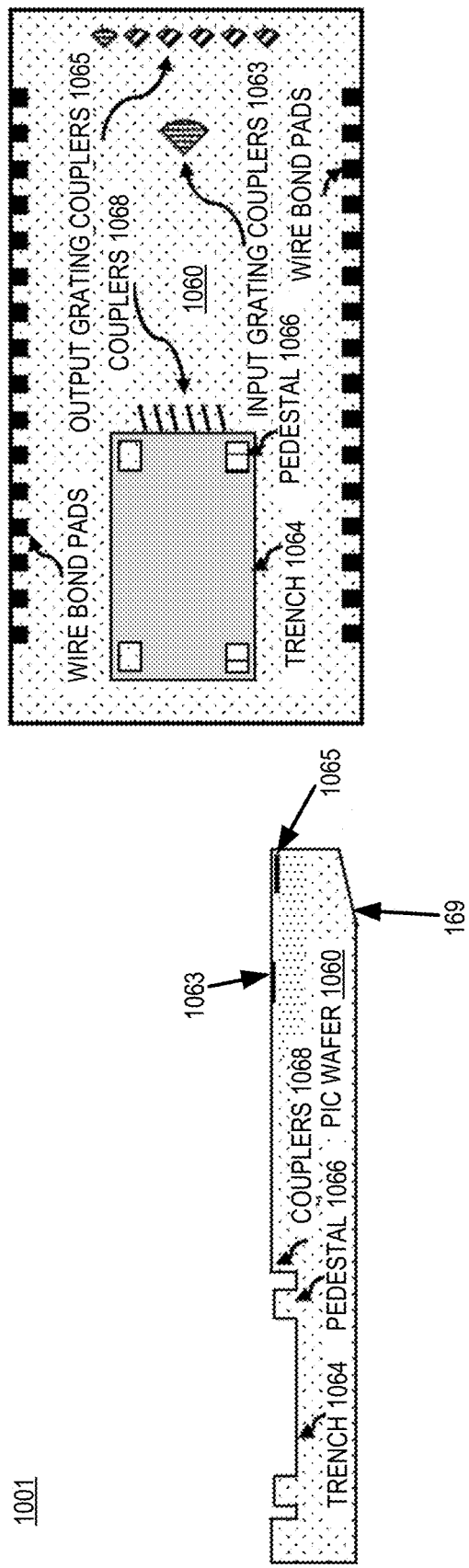
FIGS. 10-13 illustrate side views and top views of optical structures that include a PIC wafer, in accordance with implementations of the disclosure.

FIG. 10 illustrates a side view and a top view of an optical structure 1001 that includes an example PIC wafer 1060, in accordance with implementations of the disclosure. The left side of FIG. 10 (side view of optical structure 1001) shows that a deep trench 1064 and pedestals 1066 may be formed in PIC wafer 1060 to receive (and align) SOA 151. Deep trench 1064 is configured to receive solder to electrically couple SOA 151 to traces/pads of PIC wafer 1060. Pedestals 1066 are configured to assist vertical alignment of laser beams propagating between SOA 151 and PIC wafer 1060. PIC wafer 1060 may also include built-in prisms and/or lenses that are formed of PIC wafer 1060 to steer laser light. The side view of optical structure 1001 shows that output grating 1065 may be disposed deeper into PIC wafer 1060 than input grating 1063, in some implementations. Laser light propagates between PIC wafer 1060 and SOA 151 (added in FIG. 12) by way of edge couplers 1068. The right side of FIG. 10 illustrates a top view of optical structure 1001.

Figure 11:
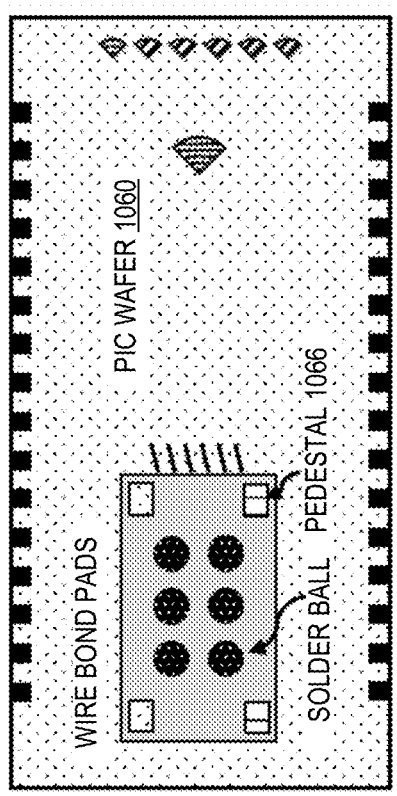
Figure 11:
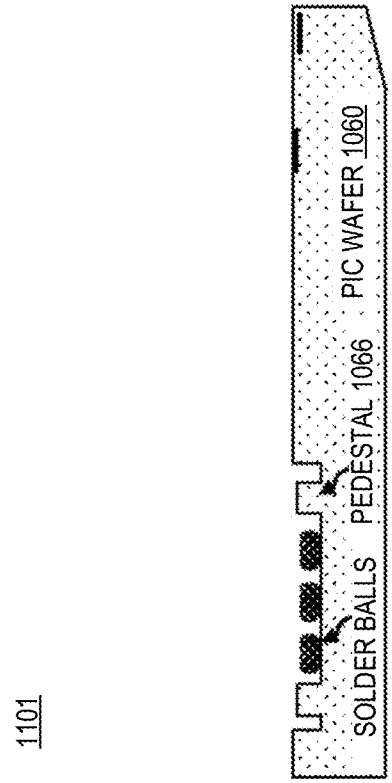

FIG. 11 illustrates a side view and a top view of an optical structure 1101 that includes solder balls formed in deep trench 1064 of PIC wafer 1060, in accordance with implementations of the disclosure. The solder balls may be implanted ("bumping") into deep trench 1064 and pressed ("coined") to lower the height of the older balls below the height of pedestals 1066.

Figure 12:
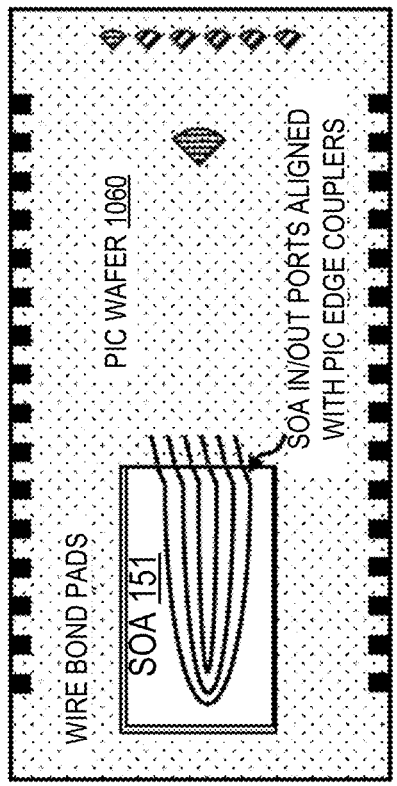
Figure 12:
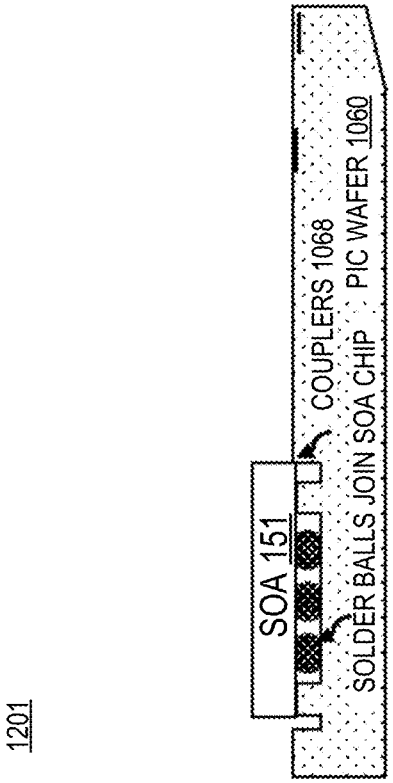

FIG. 12 illustrates a side view and a top view of an optical structure 1201 that includes bonding SOA 151 to PIC wafer 1060, in accordance with implementations of the disclosure. In some implementations, SOA 151 is flip-chip (P-side down) bonded to PIC wafer 1060. SOA 151 has input and output ports on the same edge which are coupled to edge couplers 1068 of PIC wafer 1060. Lateral alignment is achieved by flip-chip bonding while vertical alignment is controlled by the preset height of pedestals 1066. When solder balls are reflowed by heating, they will swell and rise up to touch the metal film on the surface of SOA 151, soldering SOA 151 to PIC wafer 1060.

Figure 13:
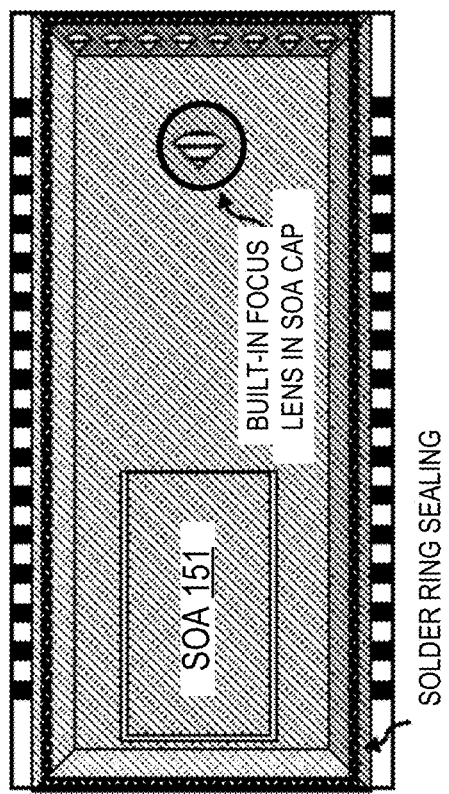
Figure 13:
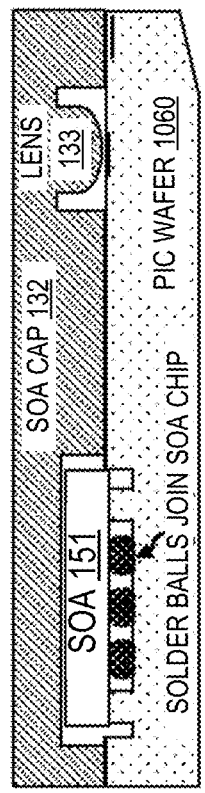

FIG. 13 illustrates a side view and a top view of an optical structure 1301 that includes capping SOA 151 with SOA capping wafer 132 that includes lens 133, in accordance with implementations of the disclosure. The operation illustrated in FIG. 13 may be performed either in vacuum or under inert ambient to provide a hermetic sealing of SOA 151.

Figure 14:
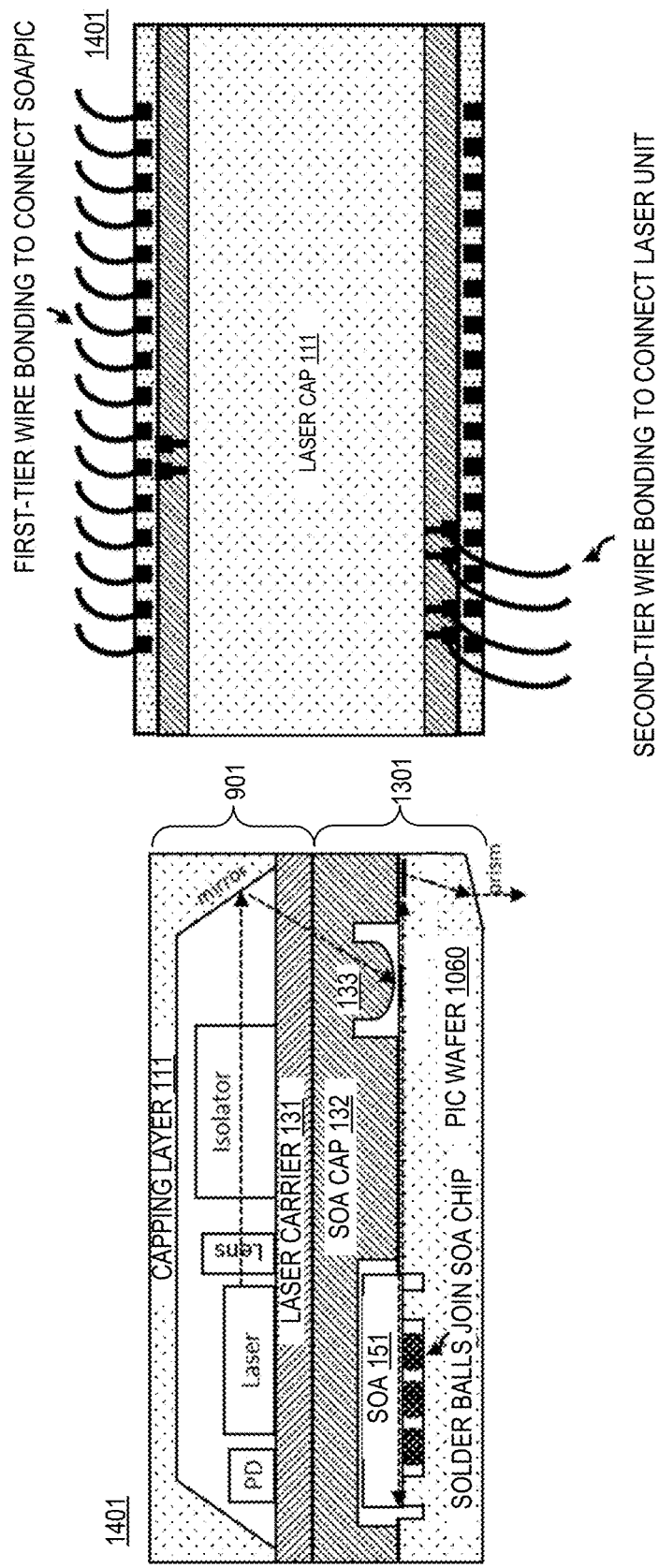
FIG. 14 illustrates a side view and a top view of an optical structure that includes the optical structure of FIG. 9 and the optical structure of FIG. 13 bonded together, in accordance with implementations of the disclosure.

FIG. 14 illustrates a side view and a top view of an optical structure 1401 that includes optical structure 901 and 1301 bonded together, in accordance with implementations of the disclosure. Bonding optical structure 901 and 1301 may be performed with wafer-to-wafer bonding or die-to-wafer bonding. After the bonding process, the wafer may be diced and known-good-die may be picked up for integration with other devices in the system. Electrical connection can be provided by wired bonding or soldering to TSV.

Implementations of the disclosure allow for fabrication of silicon photonic packages using micro-machined silicon micro-optic bench (MOB) as a device carrier and enclosure. Electrical and/or optical components may be assembled at the wafer-level to increase production scale. Additionally, using caps (e.g. capping layer 111 and/or SOA cap wafer 132) to cap the completed assembly ensemble on wafer with another cap wafer through a wafer-bonding process in vacuum or under inert ambient assists in sealing the disclosed devices from an environment of the device.

The unique physical and chemical properties of single crystalline silicon wafer may assist in fabricating a package for silicon photonic components. For example, the transparency of single crystalline silicon at infrared wavelengths allows for the use of the disclosed device in optical communication and many sensing applications including LIDAR. Additionally, single crystalline silicon can be chemically etched to form atomically flat facets at specific angles which can be made into mirrors and prisms. It can also be plasma-etched to form built-in micro lenses on wafer. It has very stable oxide as robust passivation layer, high thermal conductivity, and excellent mechanical strength. As a result, designers can integrate many key functionalities such as photonic integrated circuitry, micro-optics, heat sink, and mechanical support into one silicon wafer, as described in the disclosure.

FIG. 1A illustrates a silicon package with hybrid integration. One starts with building a PIC wafer (e.g. PIC wafer 160) with all the key functionalities for the targeted application. On this same wafer one can fabricate micro-optic components such as mirrors, lenses, and prisms for light steering. It can also be used as a chip carrier for attaching laser diodes (LD) or SOA chips with light coupled between the PIC and the light sources via either edge or grating couplers. LD and SOA are heat generating devices and the silicon wafer serves as a heat sink. Adopting a wafer-level packaging approach, designers can leverage the well-developed automated wafer testing methodology to probe and screen the completed assemblies in the ensemble on wafer, mapping out known-good-dies (KGD) for later use. Keeping the assemblies on wafer also makes wafer-bonding an accessible technique for enclosing them hermetically in vacuum or in inert ambient. In practice, several multi-functional silicon wafers can be fabricated and bonded together.

FIGS. 1A-5 illustrate different implementations of a package designs that share a structure including a laser assembly tier, a PIC tier, and a wafer layer disposed between the laser assembly tier and the PIC tier. FIGS. 6-9 illustrate an assembling process to construct a laser assembly. The assembly process starts with making a laser carrier wafer on which various thin film features are provided such as temperature sensor, metal film stack for soldering, and metal traces for electrical connection. Designers may also include through-silicon via (TSV) for electrical connection (not drawn). On this carrier designers may first attach the active devices such as LD with solder since these devices are power intensive and benefit from heat dissipation. Wire bonding is performed if there is no TSV to electrically connect these devices. Next, the passive components such as lens and isolator may be attached with UV-tacking glue in an active alignment process to achieve precise positioning. This assembling process can be applied at die-level and wafer-level assembling. Wafer-level assembly may allow for automated testing and hermetically enclosing. In the wafer-level assembling process, soldering may be done with localized heating to prevent disturbing any pre-deposited solder at the neighboring sites. After the assembling is completed and the wafer capped hermetically, wafer testing can be carried out and the KGD are diced out for later use.

FIGS. 10-13 illustrate an assembling process to attach SOA chips to a PIC wafer. The PIC wafer (e.g. PIC wafer 1060) provides deep trenches (e.g. trench 1064) to receive solder and pedestals (e.g. pedestals 1066) to mechanically support the SOA 151 and to provide vertical alignment reference. Use of solder balls allows for introduction by laser jetting or screening. Solder can also be electro-plated onto the trench bottom and reflowed to form balls. The volume and the shape of the solder deposits may be determined to satisfy the following two conditions: (1) the solder should not touch the SOA when the latter is placed on the pedestals; and (2) the solder should swell and rise up, upon reflow, to contact SOA 151 to make a joint. A practical approach is to make the under-bump metal (UBM) pad smaller in diameter than the solder ball landing on it, and to press the solder ball flat (a so-called "coining" process). This technique can reduce the solder height lower than the pedestal. Upon heating, the solder will congregate onto the UBM pad, and the limited pad area will force the solder to ball up to reach the SOA. This arrangement is made to ensure precise alignment, by avoiding placing the SOA directly on the solder before reflowing, which may result in some sliding of the SOA when solder is melted. Other features on the PIC wafer may include input/output grating and edge couplers, prisms/lenses for steering light, and wire bonding pads for electrical connection.

In the implementations illustrated in FIGS. 10-13, light is inputted and outputted to/from the PIC via grating couplers and light travels between the PIC and the SOA via edge couplers. So, the SOA and the PIC are assembled to enable direct coupling (butt coupling), which may require accurate positioning of the SOA relative to the edge couplers in the PIC. For this purpose, the pedestal height is adjusted accurately to provide proper vertical alignment, while lateral alignment may be managed by a high precision flip chip bonder. Again, the assembling process can be applied at die-level or wafer-level assembly. Wafer-level assembling may allow for automated testing and hermetically enclosing. In the wafer-level assembling process, soldering may be done with localized heating to prevent disturbing any pre-deposited solder at the neighboring sites. After the assembling is completed and the wafer capped hermetically, wafer testing can be carried out and map the KGD.

FIG. 14 illustrates final assembly operations which is attaching the laser units to the SOA/PIC units. This can be achieved with wafer-to wafer or die-to-wafer bonding. Electrical connection can be provided by two-tier wire bonding, as shown, or soldering to TSV (not specifically illustrated).

Figure 15A:
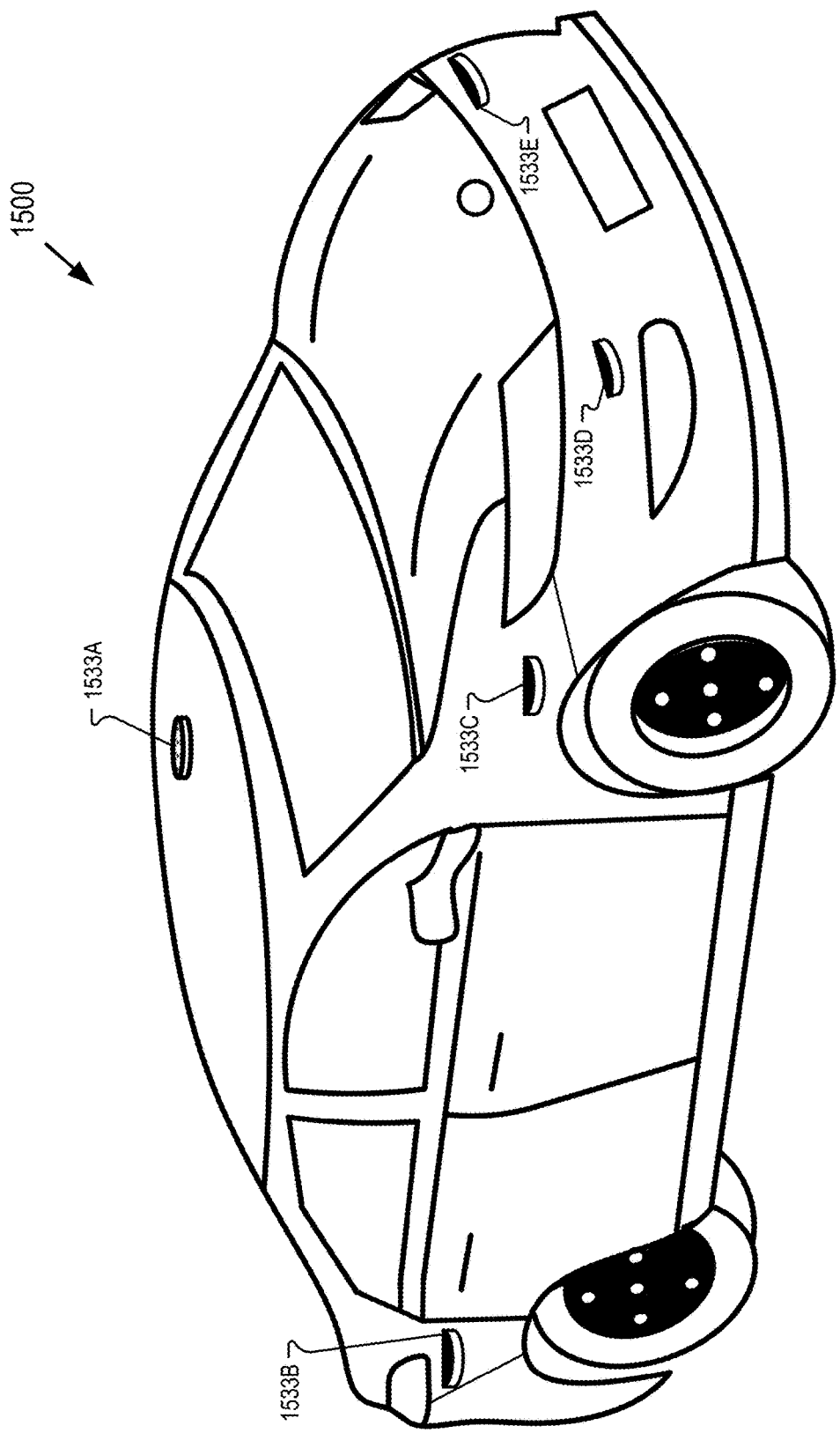
FIG. 15A illustrates an autonomous vehicle including an array of example sensors, in accordance with implementations of the disclosure.
Figure 15B:
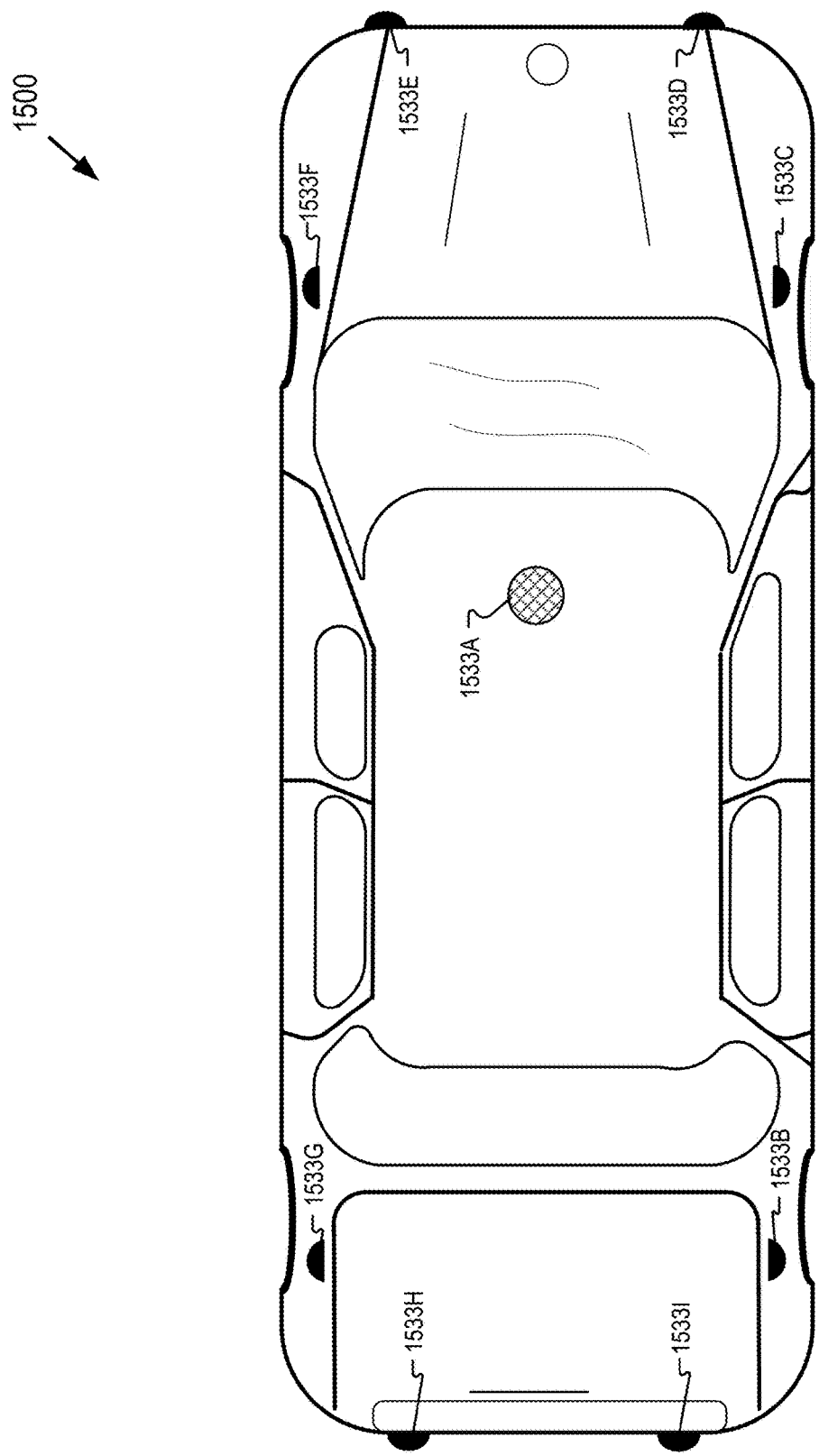
FIG. 15B illustrates a top view of an autonomous vehicle including an array of example sensors, in accordance with implementations of the disclosure.
Figure 15C:
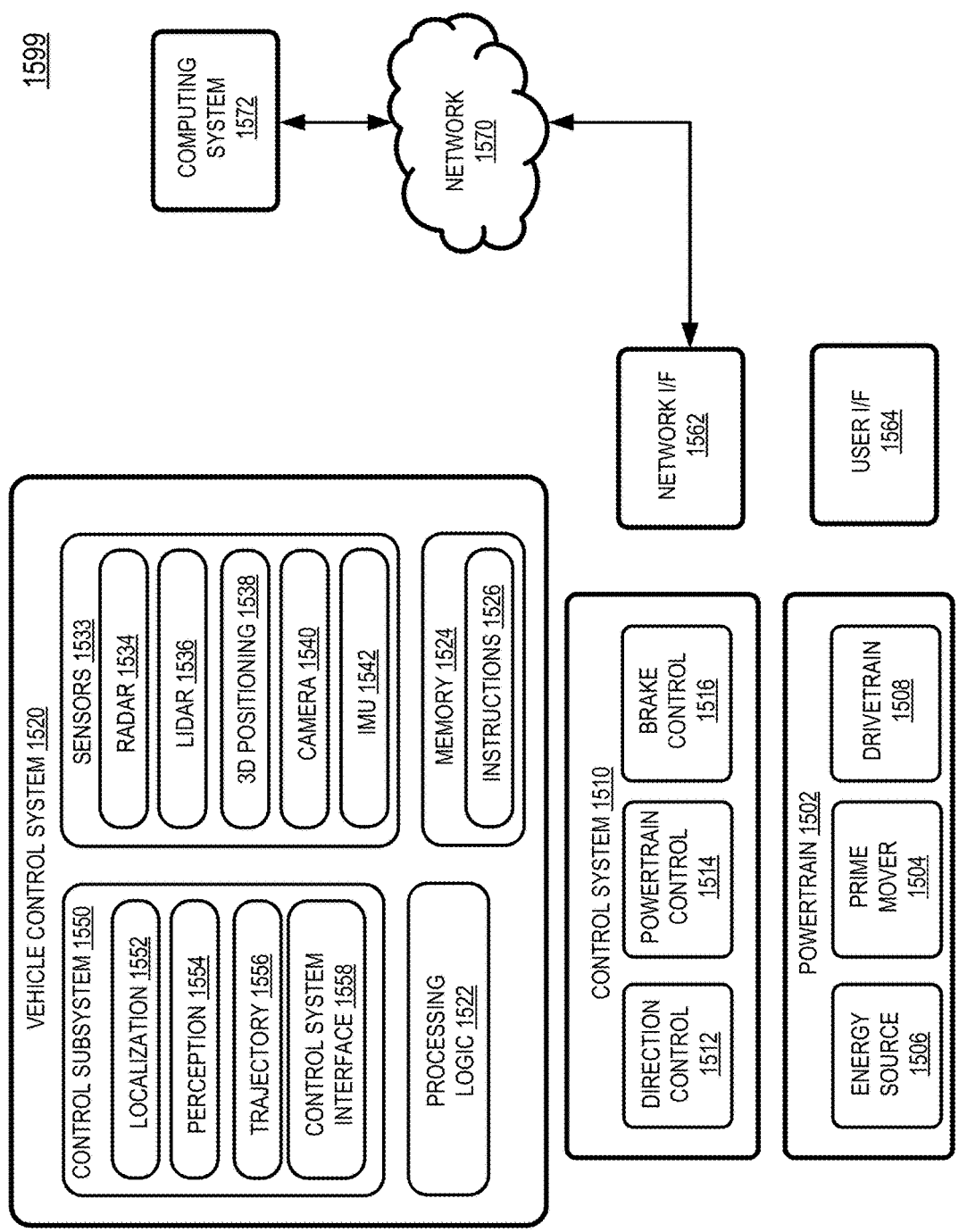
FIG. 15C illustrates an example vehicle control system including sensors, a drivetrain, and a control system, in accordance with implementations of the disclosure.

FIG. 15A illustrates an example autonomous vehicle 1500 that may include the LIDAR designs of FIGS. 1A-14, in accordance with aspects of the disclosure. The illustrated autonomous vehicle 1500 includes an array of sensors configured to capture one or more objects of an external environment of the autonomous vehicle and to generate sensor data related to the captured one or more objects for purposes of controlling the operation of autonomous vehicle 1500. FIG. 15A shows sensor 1533A, 1533B, 1533C, 1533D, and 1533E. FIG. 15B illustrates a top view of autonomous vehicle 1500 including sensors 1533F, 1533G, 1533H, and 1533I in addition to sensors 1533A, 1533B, 1533C, 1533D, and 1533E. Any of sensors 1533A, 1533B, 1533C, 1533D, 1533E, 1533F, 1533G, 1533H, and/or 1533I may include LIDAR devices that include the designs of FIGS. 1A-14. FIG. 15C illustrates a block diagram of an example system 1599 for autonomous vehicle 1500. For example, autonomous vehicle 1500 may include powertrain 1502 including prime mover 1504 powered by energy source 1506 and capable of providing power to drivetrain 1508. Autonomous vehicle 1500 may further include control system 1510 that includes direction control 1512, powertrain control 1514, and brake control 1516. Autonomous vehicle 1500 may be implemented as any number of different vehicles, including vehicles capable of transporting people and/or cargo and capable of traveling in a variety of different environments. It will be appreciated that the aforementioned components 1502-1516 can vary widely based upon the type of vehicle within which these components are utilized.

The implementations discussed hereinafter, for example, will focus on a wheeled land vehicle such as a car, van, truck, or bus. In such implementations, prime mover 1504 may include one or more electric motors and/or an internal combustion engine (among others). The energy source may include, for example, a fuel system (e.g., providing gasoline, diesel, hydrogen), a battery system, solar panels or other renewable energy source, and/or a fuel cell system. Drivetrain 1508 may include wheels and/or tires along with a transmission and/or any other mechanical drive components suitable for converting the output of prime mover 1504 into vehicular motion, as well as one or more brakes configured to controllably stop or slow the autonomous vehicle 1500 and direction or steering components suitable for controlling the trajectory of the autonomous vehicle 1500 (e.g., a rack and pinion steering linkage enabling one or more wheels of autonomous vehicle 1500 to pivot about a generally vertical axis to vary an angle of the rotational planes of the wheels relative to the longitudinal axis of the vehicle). In some implementations, combinations of powertrains and energy sources may be used (e.g., in the case of electric/gas hybrid vehicles). In some implementations, multiple electric motors (e.g., dedicated to individual wheels or axles) may be used as a prime mover.

Direction control 1512 may include one or more actuators and/or sensors for controlling and receiving feedback from the direction or steering components to enable the autonomous vehicle 1500 to follow a desired trajectory. Powertrain control 1514 may be configured to control the output of powertrain 1502, e.g., to control the output power of prime mover 1504, to control a gear of a transmission in drivetrain 1508, thereby controlling a speed and/or direction of the autonomous vehicle 1500. Brake control 1516 may be configured to control one or more brakes that slow or stop autonomous vehicle 1500, e.g., disk or drum brakes coupled to the wheels of the vehicle.

Other vehicle types, including but not limited to off-road vehicles, all-terrain or tracked vehicles, or construction equipment will necessarily utilize different powertrains, drivetrains, energy sources, direction controls, powertrain controls, and brake controls, as will be appreciated by those of ordinary skill having the benefit of the instant disclosure. Moreover, in some implementations some of the components can be combined, e.g., where directional control of a vehicle is primarily handled by varying an output of one or more prime movers. Therefore, implementations disclosed herein are not limited to the particular application of the herein-described techniques in an autonomous wheeled land vehicle.

In the illustrated implementation, autonomous control over autonomous vehicle 1500 is implemented in vehicle control system 1520, which may include one or more processors in processing logic 1522 and one or more memories 1524, with processing logic 1522 configured to execute program code (e.g. instructions 1526) stored in memory 1524. Processing logic 1522 may include graphics processing unit(s) (GPUs) and/or central processing unit(s) (CPUs), for example.

Sensors 1533A-1533I may include various sensors suitable for collecting data from an autonomous vehicle's surrounding environment for use in controlling the operation of the autonomous vehicle. For example, sensors 1533A-1533I can include RADAR unit 1534, LIDAR unit 1536, 3D positioning sensor(s) 1538, e.g., a satellite navigation system such as GPS, GLONASS, BeiDou, Galileo, or Compass. The LIDAR designs of FIGS. 1A-14 may be included in LIDAR unit 1536. LIDAR unit 1536 may include a plurality of LIDAR sensors that are distributed around autonomous vehicle 1500, for example. In some implementations, 3D positioning sensor(s) 1538 can determine the location of the vehicle on the Earth using satellite signals. Sensors 1533A-1533I can optionally include one or more ultrasonic sensors, one or more cameras 1540, and/or an Inertial Measurement Unit (IMU) 1542. In some implementations, camera 1540 can be a monographic or stereographic camera and can record still and/or video images. Camera 1540 may include a Complementary Metal-Oxide-Semiconductor (CMOS) image sensor configured to capture images of one or more objects in an external environment of autonomous vehicle 1500. IMU 1542 can include multiple gyroscopes and accelerometers capable of detecting linear and rotational motion of autonomous vehicle 1500 in three directions. One or more encoders (not illustrated) such as wheel encoders may be used to monitor the rotation of one or more wheels of autonomous vehicle 1500.

The outputs of sensors 1533A-1533I may be provided to control subsystems 1550, including, localization subsystem 1552, trajectory subsystem 1556, perception subsystem 1554, and control system interface 1558. Localization subsystem 1552 is configured to determine the location and orientation (also sometimes referred to as the "pose") of autonomous vehicle 1500 within its surrounding environment, and generally within a particular geographic area. The location of an autonomous vehicle can be compared with the location of an additional vehicle in the same environment as part of generating labeled autonomous vehicle data. Perception subsystem 1554 may be configured to detect, track, classify, and/or determine objects within the environment surrounding autonomous vehicle 1500. Trajectory subsystem 1556 is configured to generate a trajectory for autonomous vehicle 1500 over a particular timeframe given a desired destination as well as the static and moving objects within the environment. A machine learning model in accordance with several implementations can be utilized in generating a vehicle trajectory. Control system interface 1558 is configured to communicate with control system 1510 in order to implement the trajectory of the autonomous vehicle 1500. In some implementations, a machine learning model can be utilized to control an autonomous vehicle to implement the planned trajectory.

Vehicle control system 1520 may be configured to control powertrain 1502 of autonomous vehicle 1500 in response to signals generated by photodetectors included in sensors 1533. One or more photodetectors (e.g. photodiodes or image sensors) may be configured to receive reflected infrared laser light from targets (e.g. objects) in an environment of the autonomous vehicle control system that reflect amplified laser light generated by SOA 151 and outcoupled from the devices as exit light 199. The photodetectors may be included in LIDAR unit(s) 1536 and the devices disclosed in FIGS. 1A-14 may also be included in LIDAR unit(s) 1536. Vehicle control system 1520 may be configured to control powertrain 1502 of autonomous vehicle 1500 in response to outputs from a plurality of LIDAR sensors 1536.

It will be appreciated that the collection of components illustrated in FIG. 15C for vehicle control system 1520 is merely exemplary in nature. Individual sensors may be omitted in some implementations. In some implementations, different types of sensors illustrated in FIG. 15C may be used for redundancy and/or for covering different regions in an environment surrounding an autonomous vehicle. In some implementations, different types and/or combinations of control subsystems may be used. Further, while subsystems 1552-1558 are illustrated as being separate from processing logic 1522 and memory 1524, it will be appreciated that in some implementations, some or all of the functionality of subsystems 1552-1558 may be implemented with program code such as instructions 1526 resident in memory 1524 and executed by processing logic 1522, and that these subsystems 1552-1558 may in some instances be implemented using the same processor(s) and/or memory. Subsystems in some implementations may be implemented at least in part using various dedicated circuit logic, various processors, various field programmable gate arrays ("FPGA"), various application-specific integrated circuits ("ASIC"), various real time controllers, and the like, as noted above, multiple subsystems may utilize circuitry, processors, sensors, and/or other components. Further, the various components in vehicle control system 1520 may be networked in various manners.

In some implementations, different architectures, including various combinations of software, hardware, circuit logic, sensors, and networks may be used to implement the various components illustrated in FIG. 15C. Each processor may be implemented, for example, as a microprocessor and each memory may represent the random access memory ("RAM") devices comprising a main storage, as well as any supplemental levels of memory, e.g., cache memories, non-volatile or backup memories (e.g., programmable or flash memories), or read-only memories. In addition, each memory may be considered to include memory storage physically located elsewhere in autonomous vehicle 1500, e.g., any cache memory in a processor, as well as any storage capacity used as a virtual memory, e.g., as stored on a mass storage device or another computer controller. Processing logic 1522 illustrated in FIG. 15C, or entirely separate processing logic, may be used to implement additional functionality in autonomous vehicle 1500 outside of the purposes of autonomous control, e.g., to control entertainment systems, to operate doors, lights, or convenience features.

In addition, for additional storage, autonomous vehicle 1500 may also include one or more mass storage devices, e.g., a removable disk drive, a hard disk drive, a direct access storage device ("DASD"), an optical drive (e.g., a CD drive, a DVD drive), a solid-state storage drive ("SSD"), network attached storage, a storage area network, and/or a tape drive, among others. Furthermore, autonomous vehicle 1500 may include a user interface 1564 to enable autonomous vehicle 1500 to receive a number of inputs from a passenger and generate outputs for the passenger, e.g., one or more displays, touchscreens, voice and/or gesture interfaces, buttons and other tactile controls. In some implementations, input from the passenger may be received through another computer or electronic device, e.g., through an app on a mobile device or through a web interface.

In some implementations, autonomous vehicle 1500 may include one or more network interfaces, e.g., network interface 1562, suitable for communicating with one or more networks 1570 (e.g., a Local Area Network ("LAN"), a wide area network ("WAN"), a wireless network, and/or the Internet, among others) to permit the communication of information with other computers and electronic devices, including, for example, a central service, such as a cloud service, from which autonomous vehicle 1500 receives environmental and other data for use in autonomous control thereof. In some implementations, data collected by one or more sensors 1533A-1533I can be uploaded to computing system 1572 through network 1570 for additional processing. In such implementations, a time stamp can be associated with each instance of vehicle data prior to uploading.

Processing logic 1522 illustrated in FIG. 15C, as well as various additional controllers and subsystems disclosed herein, generally operates under the control of an operating system and executes or otherwise relies upon various computer software applications, components, programs, objects, modules, or data structures, as may be described in greater detail below. Moreover, various applications, components, programs, objects, or modules may also execute on one or more processors in another computer coupled to autonomous vehicle 1500 through network 1570, e.g., in a distributed, cloud-based, or client-server computing environment, whereby the processing required to implement the functions of a computer program may be allocated to multiple computers and/or services over a network.

Routines executed to implement the various implementations described herein, whether implemented as part of an operating system or a specific application, component, program, object, module or sequence of instructions, or even a subset thereof, will be referred to herein as "program code." Program code typically comprises one or more instructions that are resident at various times in various memory and storage devices, and that, when read and executed by one or more processors, perform the steps necessary to execute steps or elements embodying the various aspects of the invention. Moreover, while implementations have and hereinafter may be described in the context of fully functioning computers and systems, it will be appreciated that the various implementations described herein are capable of being distributed as a program product in a variety of forms, and that implementations can be implemented regardless of the particular type of computer readable media used to actually carry out the distribution. Examples of computer readable media include tangible, non-transitory media such as volatile and non-volatile memory devices, floppy and other removable disks, solid state drives, hard disk drives, magnetic tape, and optical disks (e.g., CD-ROMs, DVDs) among others.

In addition, various program code described hereinafter may be identified based upon the application within which it is implemented in a specific implementation. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets), it should be appreciated that the invention is not limited to the specific organization and allocation of program functionality described herein.

Those skilled in the art, having the benefit of the present disclosure, will recognize that the exemplary environment illustrated in FIG. 15C is not intended to limit implementations disclosed herein. Indeed, those skilled in the art will recognize that other alternative hardware and/or software environments may be used without departing from the scope of implementations disclosed herein.

The term "processing logic" (e.g. processing logic 1522) in this disclosure may include one or more processors, microprocessors, multi-core processors, Application-specific integrated circuits (ASIC), and/or Field Programmable Gate Arrays (FPGAs) to execute operations disclosed herein. In some implementations, memories (not illustrated) are integrated into the processing logic to store instructions to execute operations and/or store data. Processing logic may also include analog or digital circuitry to perform the operations in accordance with implementations of the disclosure.

A "memory" or "memories" described in this disclosure may include one or more volatile or non-volatile memory architectures. The "memory" or "memories" may be removable and non-removable media implemented in any method or technology for storage of information such as computer-readable instructions, data structures, program modules, or other data. Example memory technologies may include RAM, ROM, EEPROM, flash memory, CD-ROM, digital versatile disks (DVD), high-definition multimedia/data storage disks, or other optical storage, magnetic cassettes, magnetic tape, magnetic disk storage or other magnetic storage devices, or any other non-transmission medium that can be used to store information for access by a computing device.

A Network may include any network or network system such as, but not limited to, the following: a peer-to-peer network; a Local Area Network (LAN); a Wide Area Network (WAN); a public network, such as the Internet; a private network; a cellular network; a wireless network; a wired network; a wireless and wired combination network; and a satellite network.

Communication channels may include or be routed through one or more wired or wireless communication utilizing IEEE 802.11 protocols, SPI (Serial Peripheral Interface), I²C (Inter-Integrated Circuit), USB (Universal Serial Port), CAN (Controller Area Network), cellular data protocols (e.g. 3G, 4G, LTE, 5G), optical communication networks, Internet Service Providers (ISPs), a peer-to-peer network, a Local Area Network (LAN), a Wide Area Network (WAN), a public network (e.g. "the Internet"), a private network, a satellite network, or otherwise.

A computing device may include a desktop computer, a laptop computer, a tablet, a phablet, a smartphone, a feature phone, a server computer, or otherwise. A server computer may be located remotely in a data center or be stored locally.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated implementations of the invention, including what is described in the Abstract, is not intended to be exhaustive or to limit the invention to the precise forms disclosed. While specific implementations of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific implementations disclosed in the specification. Rather, the scope of the invention is to be determined entirely by the following claims, which are to be construed in accordance with established doctrines of claim interpretation.

What is claimed is:

1. A light detection and ranging (LIDAR) device for an autonomous vehicle, the LIDAR device comprising:
   a laser assembly tier including a laser configured to emit laser light;
   a photonic integrated circuit (PIC) tier including:
   a semiconductor optical amplifier (SOA); and
   a PIC wafer configured to incouple the laser light into the PIC wafer and direct the laser light to the SOA; and
   a wafer layer disposed between the laser assembly tier and the PIC wafer.

2. The LIDAR device of claim 1, wherein the laser light is infrared laser light, and wherein the wafer layer is transparent to the infrared laser light.

3. The LIDAR device of claim 2, wherein the wafer layer includes a lens configured to receive the infrared laser light from the laser assembly tier, and wherein the lens is integrated into the wafer layer and configured to focus the infrared laser light to an input grating of the PIC wafer.

4. The LIDAR device of claim 2, wherein the wafer layer includes:
 a laser carrier wafer, wherein the laser is coupled to the laser carrier wafer; and
 an SOA cap wafer that seals the SOA from an environment of the LIDAR device, wherein the SOA cap wafer is disposed between the PIC wafer and the laser carrier wafer.

5. The LIDAR device of claim 2, wherein the wafer layer and the PIC wafer are formed of single crystalline silicon.

6. The LIDAR device of claim 2, wherein the wafer layer seals the SOA from an environment of the LIDAR device, and wherein the laser is coupled to the wafer layer.

7. The LIDAR device of claim 1, wherein the wafer layer includes a lens configured to receive the laser light from the laser assembly tier, and wherein the lens is integrated into the wafer layer and configured to focus the laser light to an input grating of the PIC wafer.

8. The LIDAR device of claim 1, wherein the PIC wafer includes an exit feature integrated into the PIC wafer, wherein the exit feature is configured to receive amplified laser light generated by the SOA and outcouple the amplified laser light from the PIC wafer.

9. The LIDAR device of claim 1, wherein the laser assembly tier includes a laser lens disposed between the laser and a mirror of the laser assembly tier, and wherein the laser lens is configured to collimate the laser light emitted from the laser.

10. The LIDAR device of claim 1, wherein the SOA is flip-bonded to the PIC wafer.

11. The LIDAR device of claim 1, wherein the PIC wafer includes:
 a trench sized to receive solder for the SOA; and
 pedestals formed of the PIC wafer to mechanically support the SOA and to provide vertical alignment reference.

12. The LIDAR device of claim 1, wherein the PIC wafer includes one or more edge couplers to receive the laser light from an input grating of the PIC wafer, wherein the one or more edge couplers are configured to incouple the laser light into the SOA.

13. The LIDAR device of claim 12, wherein an output grating of the PIC wafer is disposed deeper into the PIC wafer than the input grating.

14. The LIDAR device of claim 1, wherein the laser assembly tier further includes:
 a capping layer sealing the laser from an environment of the LIDAR device; and
 a mirror disposed on an angled wall of the capping layer, and wherein the PIC wafer includes an input grating and an output grating, the input grating configured to incouple the laser light reflected from the mirror and direct the laser light to the SOA, and wherein the output grating is configured to receive amplified laser light from the SOA and outcouple the amplified laser light out of the PIC wafer.

15. An autonomous vehicle control system comprising:
 a light detection and ranging (LIDAR) device including a laser assembly tier and a photonic integrated circuit (PIC) tier, wherein the laser assembly tier includes an infrared laser configured to emit infrared laser light, wherein the PIC tier includes a semiconductor optical amplifier (SOA) and a PIC wafer configured to incouple the infrared laser light into the PIC wafer and direct the infrared laser light to the SOA, and wherein the LIDAR device includes a wafer layer disposed between the laser assembly tier and the PIC wafer;
 a photodetector configured to receive reflected infrared laser light from targets in an environment of the autonomous vehicle control system that reflect amplified laser light generated by the SOA; and
 one or more processors to control the autonomous vehicle control system in response to signals generated by the photodetector.

16. The autonomous vehicle control system of claim 15, wherein the wafer layer is transparent to the infrared laser light.

17. The autonomous vehicle control system of claim 16, wherein the wafer layer includes a lens configured to receive the infrared laser light from the laser assembly tier, and wherein the lens is integrated into the wafer layer and configured to focus the infrared laser light to an input grating of the PIC wafer.

18. The autonomous vehicle control system of claim 16, wherein the wafer layer includes:
 a laser carrier wafer, wherein the infrared laser is coupled to the laser carrier wafer; and
 an SOA cap wafer that seals the SOA from the environment of the autonomous vehicle control system, wherein the SOA cap wafer is disposed between the PIC wafer and the laser carrier wafer.

19. An autonomous vehicle comprising:
 a light detection and ranging (LIDAR) device including a laser assembly tier and a photonic integrated circuit (PIC) tier, wherein the laser assembly tier includes a near-infrared laser configured to emit near-infrared laser light, wherein the PIC tier includes a semiconductor optical amplifier (SOA) and a PIC wafer configured to incouple the near-infrared laser light into the PIC wafer and direct the near-infrared laser light to the SOA, and wherein the LIDAR device includes a wafer layer disposed between the laser assembly tier and the PIC wafer;
 a photodetector configured to receive reflected near-infrared laser light from targets in an environment of the autonomous vehicle that reflect amplified laser light generated by the SOA; and
 one or more processors to control the autonomous vehicle in response to signals generated by the photodetector.

20. The autonomous vehicle of claim 19, wherein the wafer layer is transparent to the near-infrared laser light.

\* \* \* \* \*